US012372582B2

United States Patent
Zhu et al.

(10) Patent No.: US 12,372,582 B2
(45) Date of Patent: Jul. 29, 2025

(54) SOC ESTIMATION METHOD AND SYSTEM WITH ADVANCED PARAMETER IDENTIFICATION AND INTEGRATING INFINITE ALGORITHM

(71) Applicant: Qilu Univ. of Technology (Shandong Acad. of Sci.), Jinan (CN)

(72) Inventors: Yunhai Zhu, Jinan (CN); Henggang Miao, Jinan (CN); Dongdong Hou, Jinan (CN); Xiaojin Gao, Jinan (CN); Hongjin Ouyang, Jinan (CN)

(73) Assignee: Qilu Univ. of Technology (Shandong Acad. of Sci.), Jinan (CN)

( * ) Notice: Subject to any disclaimer, the term of this patent is extended or adjusted under 35 U.S.C. 154(b) by 0 days.

(21) Appl. No.: 18/891,440

(22) Filed: Sep. 20, 2024

(65) Prior Publication Data

US 2025/0208216 A1 Jun. 26, 2025

(51) Int. Cl.
*G01R 31/367* (2019.01)
*G01R 31/388* (2019.01)

(52) U.S. Cl.
CPC ......... *G01R 31/367* (2019.01); *G01R 31/388* (2019.01)

(58) Field of Classification Search
CPC ........................... G01R 31/388; G01R 31/367
See application file for complete search history.

(56) References Cited

U.S. PATENT DOCUMENTS

| 10,175,303 | B2 | 1/2019 | Baba et al. | |
| 2014/0214348 | A1* | 7/2014 | Sahinoglu | G01R 31/3842 702/63 |
| 2014/0244225 | A1* | 8/2014 | Balasingam | G01R 31/3835 703/2 |
| 2015/0377974 | A1 | 12/2015 | Choi | |
| 2016/0061908 | A1 | 3/2016 | Torai et al. | |
| 2017/0328957 | A1 | 11/2017 | Suzuki et al. | |
| 2018/0083461 | A1 | 3/2018 | Ravi et al. | |
| 2019/0187212 | A1 | 6/2019 | Garcia et al. | |
| 2019/0250215 | A1 | 8/2019 | Sung | |
| 2020/0031925 | A1 | 1/2020 | Benkirane et al. | |
| 2021/0055348 | A1 | 2/2021 | Kim et al. | |
| 2022/0234449 | A1* | 7/2022 | Altaf | G01R 31/367 |
| 2023/0152380 | A1* | 5/2023 | Liu | G01R 31/367 320/132 |
| 2023/0358810 | A1* | 11/2023 | Rayappan | G01R 31/3842 |

FOREIGN PATENT DOCUMENTS

| CN | 115327415 A | 11/2022 |
| CN | 116754959 A | 9/2023 |

* cited by examiner

*Primary Examiner* — Ricky Go
(74) *Attorney, Agent, or Firm* — David & Raymond Patent Firm; Raymond Y Chan (57) ABSTRACT

A SOC estimation method and system with advanced parameter identification and integrating infinite algorithm for battery monitoring is disclosed. According to the dynamic and static characteristics of the battery, a second-order RC equivalent circuit model is established, wherein the state equation and output equation of the model are calculated. A variable forgetting factor recursive least squares algorithm incorporating finite memory is utilized for parameter identification. An adaptive unscented H infinite filter algorithm is combined with a second-order RC equivalent circuit model with known parameters to establish the SOC estimation model, which can accurately reflect the state information of the battery to accurately estimate the SOC value of the battery.

6 Claims, 4 Drawing Sheets

SOC ESTIMATION METHOD AND SYSTEM WITH ADVANCED PARAMETER IDENTIFICATION AND INTEGRATING INFINITE ALGORITHM

CROSS REFERENCE OF RELATED APPLICATION

This application is a non-provisional application that claims the benefit of priority under 35U.S.C. § 119 to a Chinese application, application number 202311773694.8, filed Dec. 22, 2023, which is incorporated herewith by reference in its entirety.

BACKGROUND OF THE PRESENT INVENTION

Field of Invention

The invention relates to the technical field of battery monitoring, and more particularly to a SOC (State of Charge) estimation method and system thereof with advanced parameter identification and integrating infinite algorithm.

Description of Related Arts

The description in this section merely provides background information related to the present invention and does not necessarily constitute prior art of the invention.

With the development of the automobile industry, the problems of environmental pollution and energy shortage are increasingly serious. In the process of continuous development of the power battery, the lithium battery has become a main energy storage device of the current electric automobile due to its characteristics of high energy density and long cycle life. In order to ensure the lithium battery works within a safe and reliable working range, the power battery must be effectively managed and controlled to significantly ensure the safety, durability and power performance of the battery. A Battery Management System (BMS) is a core component of an electric vehicle, that is important to protect the battery safety, improve the vehicle performance, and prolong the battery life span, wherein the State Of Charge (SOC) of the power battery is one of the key parameters in the battery management system that reflects the remaining capacity parameter of the power battery. The SOC is also related to the condition monitoring and service life span of the battery.

Regarding to the current estimation of the SOC value, firstly a circuit model parameter identification method is adopted to identify the external characteristics of the battery, and then a filtering algorithm is combined to process the estimation of the SOC. In the method for identifying parameters of the lithium battery equivalent circuit model, the least squares method and an improved algorithm thereof are mainly adopted, such as a Recursive Least Squares (RLS) algorithm, a Forgetting Factor Recursive Least Squares (FF-RLS) algorithm, a Variable Forgetting Factor Recursive Least Squares (VFF-RLS) algorithm, and etc., and while in the SOC estimation filtering algorithm of the lithium battery equivalent circuit model, the common method is mainly adopted a Kalman filtering algorithm and an improved method thereof, such as an extended Kalman filtering algorithm, an unscented Kalman filtering algorithm, an adaptive Kalman filtering algorithm, and etc..

The inventors of the present invention find that, the conventional least squares algorithm and the improved algorithms thereof have good estimation characteristics in dealing with a nonlinear system, but data saturation occurs along with the increase of data. Although the Kalman filtering and improved adaptive algorithms have better adaptability to uncertainty, abnormal value conditions and inaccurate SOC initial values, there are problems of having stronger nonlinearity in identifying the curve of change of each parameter, non-Gaussian noise and the like when the battery is used for a period of time, resulting that the accuracy of SOC data obtained by the conventional algorithm is greatly reduced and failing to meet the application requirements.

SUMMARY OF THE PRESENT INVENTION

In order to solve the above problem, the present invention proposes a SOC estimation method and system with advanced parameter identification and integrating infinite algorithm, utilizing a variable forgetting factor recursive least squares (FM-VFFRLS) algorithm with finite memory to perform parameter identification, and simultaneously combining an adaptive unscented H infinite filtering algorithm (AFOUHF) to estimate the SOC of lithium battery, so as to accurately respond to the status information of the battery and accurately estimate the SOC value of the battery.

According to the present invention, the foregoing and other objects and advantages are attained by the following technical solutions:

One or more embodiments provide a SOC estimation method with advanced parameter identification and integrating infinite algorithm, including the following steps:
  establishing a second-order RC (Resistor-Capacitor) equivalent circuit model according to dynamic and static characteristics of a battery;
  calculating a state equation and an output equation of the second-order RC equivalent circuit model being established;
  performing a parameter identification using the output equation and the state equation calculated by configuring with a variable forgetting factor recursive least squares (VFF-RLS) algorithm incorporating a finite memory window and obtaining parameters of elements (two stages of resistor-capacitor pairs arranged in parallel) of the second-order RC equivalent circuit model;
  combining an adaptive unscented H infinite (H∞) filtering algorithm with the second-order RC equivalent circuit model with the parameters obtained to establish a SOC estimation model and to obtain a SOC predication estimation value; and
  correcting the SOC predication estimation value by adjusting one or more noise coefficients through the adaptive unscented H infinite filtering algorithm and to obtain a SOC estimated value.

One or more embodiments provide a SOC estimation system with advanced parameter identification and integrating infinite algorithm, comprising:
  a model construction module configured to establish a second-order RC equivalent circuit model according to dynamic and static characteristics of a battery;
  a computation module configured to calculate a state equation and an output equation based on the second-order RC equivalent circuit model being established;
  a parameter identification module configured to identify parameters (resistance and capacitance values) of elements of the second-order RC equivalent circuit model, using the output equation and the state equation calculated, by configuring with the variable forgetting factor recursive least squares algorithm incorporating a finite memory window;

a SOC estimation module established by combining an adaptive unscented H infinite filtering algorithm with the second-order RC equivalent circuit model with the parameters identified to obtain a SOC prediction estimation value; and a correction module configured to correct the SOC prediction estimation value by adjusting one or more noise coefficients through the adaptive unscented H infinite filtering algorithm to obtain a SOC estimated value.

An electronic device comprises a memory unit configured to store computer instructions and a processor configured to process the computer instructions to execute the steps of the above SOC estimation method with advanced parameter identification and integrating infinite algorithm.

A computer readable storage medium for storing computer instructions which, when executed by a processor, executes the steps of the above SOC estimation method with advanced parameter identification and integrating infinite algorithm.

In comparison with the prior art, the present invention has the following beneficial effects:

According to the present invention, on the basis of the second-order RC equivalent circuit model, the parameter identification of the variable forgetting factor recursive least squares algorithm incorporates the finite memory that updates and improves the conventional parameter identification method and eliminates the influence of old data in the parameter identification result of the recursive least squares method, which improves the identification precision of each parameter in the equivalent circuit model.

The present invention is based on the adaptive unscented H infinite filtering algorithm (AFOUHF) of the second-order RC equivalent circuit model, which utilizes the unscented Kalman filtering algorithm (UKF) as a main framework, but according to this basis, in view of the problem that the statistical characteristic of the observed noise of the UKF algorithm is required to be assumed as white noise, the H infinite filtering algorithm is introduced, that filters out non-Gaussian noise by minimizing the maximum estimation error and adds an adaptive part, such that the accuracy and robustness of algorithm prediction are improved.

The advantages of the present invention, as well as additional aspects of the invention, will be described in detail in the following detailed embodiments.

BRIEF DESCRIPTION OF THE DRAWINGS

The accompanying drawings, which form part of the invention, are intended to provide a further understanding of the invention, and the illustrative embodiments of the invention and the description thereof are intended to explain the invention and are not intended to limit the invention.

DETAILED DESCRIPTION OF THE PREFERRED EMBODIMENT

The present invention is further described with reference to the accompanying drawings and embodiments.

It should be noted that the following detailed description is exemplary and is intended to provide further explanation of the present invention. Unless defined otherwise, all technical and scientific terms used herein have the same meaning as commonly understood by one of ordinary skill in the art to which the present invention belongs.

It is noted that the terminology used herein is for the purpose of describing particular embodiments only and is not intended to be limiting of exemplary embodiments according to the present invention. As used herein, the singular is also intended to include the plural unless the context clearly indicates otherwise, and furthermore, it is to be understood that the terms "include" and/or "including" when used in this specification are taken to specify the presence of stated features, steps, operations, devices, components, and/or combinations thereof. It should be noted that, in the case of no conflict, the embodiments of the present invention and features of the embodiments may be combined with each other. The embodiments will be described in detail below with reference to the accompanying drawings.

First Embodiment

Figure 1:
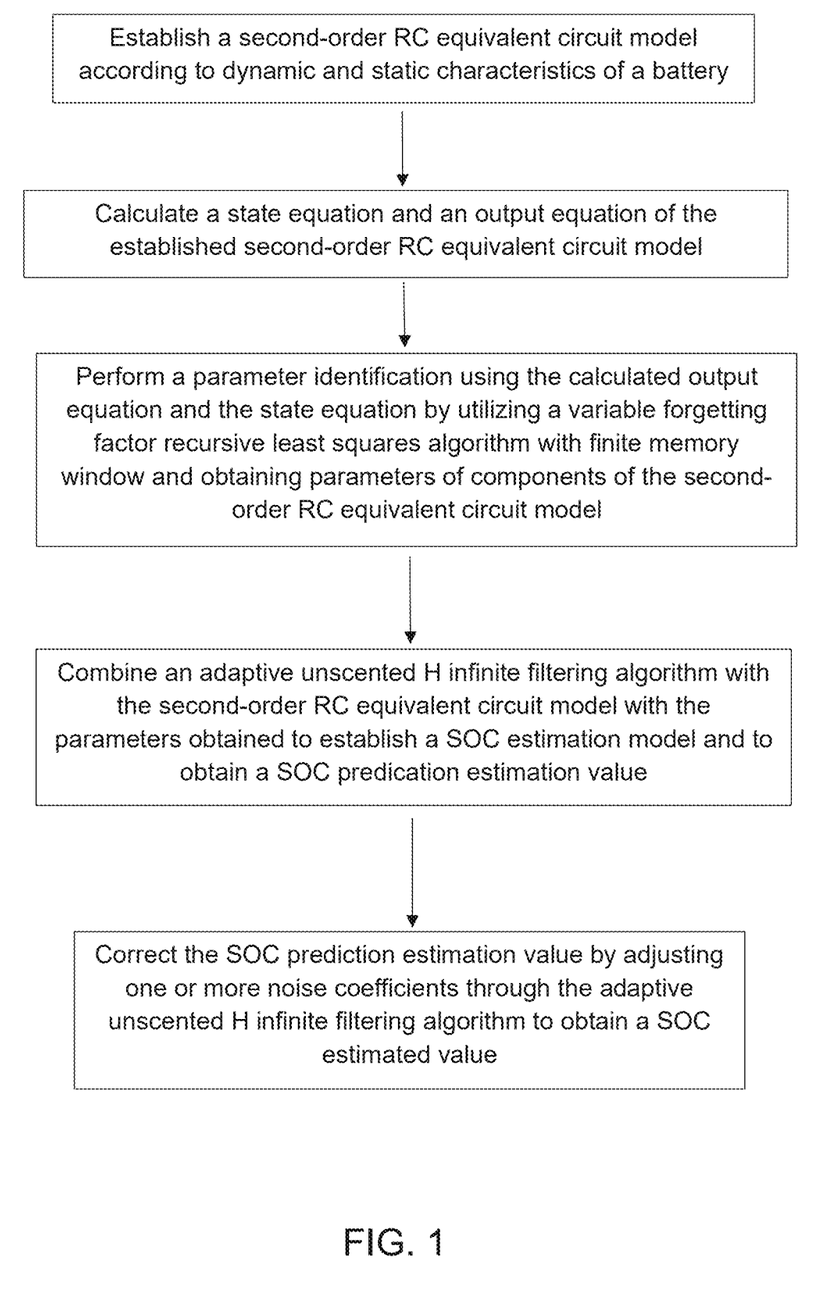
FIG. 1 is a flowchart illustrating steps of the SOC estimation method according to a first preferred embodiment of the present invention.
Figure 2:
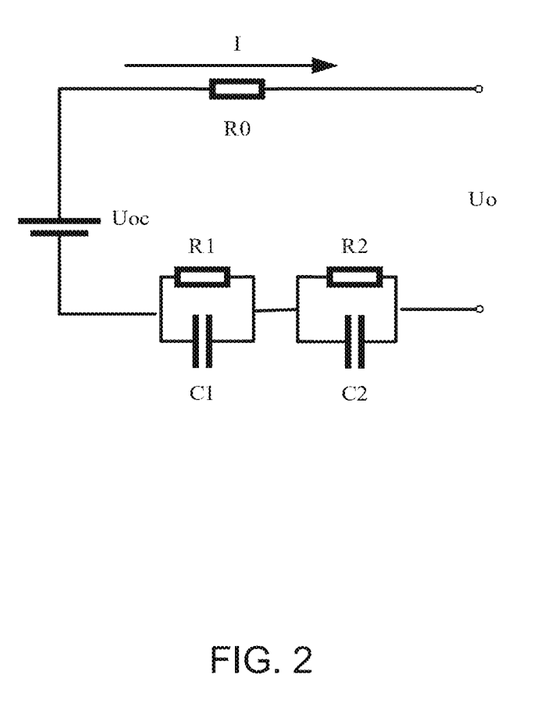
FIG. 2 is a circuit diagram of the second-order RC equivalent circuit model of the battery according to the above first preferred embodiment of the present invention.

Referring to FIG. 1 to FIG. 6, in the technical solution disclosed in one or more embodiments, a SOC estimation method with advanced parameter identification and integrating infinity algorithm includes the following steps:

Step 1: establishing a second-order RC (Resistor-Capacitor) equivalent circuit model according to dynamic and static characteristics of a battery;

Step 2: calculating a state equation and an output equation of the second-order RC equivalent circuit model being established;

Step 3: performing a parameter identification on the output equation and state equation calculated by utilizing a variable forgetting factor recursive least squares (VFF-RLS) algorithm with a finite memory window and obtaining parameters of elements (such as two stages of resistor-capacitor pairs arranged in parallel as shown in FIG. 2) of the second-order RC equivalent circuit model;

Step 4: combining an adaptive unscented H infinite filtering algorithm with the second-order RC equivalent circuit model with the parameters obtained to establish a SOC estimation model and to obtain a SOC prediction estimation value;

Step 5: correcting the SOC prediction estimation value by adjusting one or more noise coefficients through the adaptive unscented H infinite filtering algorithm to obtain the SOC estimated value.

In the first preferred embodiment, on the basis of the second-order RC equivalent circuit model, the parameter identification of the variable forgetting factor recursive least squares algorithm incorporates the finite memory, that updates and improves the conventional parameter identification method and eliminates the influence of old data of the recursive least squares method on a parameter identification result, which improves the identification precision of each parameter in the equivalent circuit model. In addition, based on the adaptive unscented H infinite filtering Algorithm (AFOUHF) of the second-order RC equivalent circuit model, the main framework used by the algorithm is Unscented Kalman Filter (UKF) algorithm, wherein in view of the statistical characteristics of the UKF observation noise, the H infinite filtering algorithm is introduced, that filters out non-Gaussian noise by minimizing the maximum estimation error and then adds an adaptive part, so that the Gaussian noise is eliminated and the accuracy and the robustness of algorithm prediction are further improved.

In the Step 1, the establishing of the second-order RC equivalent circuit model includes the following steps:
  designing a reliable lithium battery state estimation algorithm while accurate modeling is indispensable in order to more accurately describe external characteristics of the lithium battery; and
  according to the complex electrochemical reaction inside the lithium battery, establishing the second-order RC equivalent circuit model for the power lithium battery as shown in FIG. 2, which represents thermodynamic equilibrium potential of the power battery based on a voltage source, and utilizes a RC network to describe dynamic characteristics of the power battery, so as to achieve an objective of accurately estimating SOC parameters of the battery.

Specifically, the second-order RC equivalent circuit model includes:
  1. a voltage source: using an open-circuit voltage $U_{oc}$ to represent an open-circuit voltage of the power battery;
  2. an ohmic internal resistance: using $R_0$ to represent a contact resistance of an electrode material of the power battery, electrolyte, diaphragm resistance and other elements;
  3. a RC network: using a polarization internal resistance R and a polarization capacitance C to describe dynamic characteristics of the power battery, including polarization characteristics, diffusion effects, and the like.

Specifically, the state equation of the second-order RC equivalent circuit model is:

$$\begin{cases} U_t = U_{OC} - R_0 I - U_1 - U_2 \\ I = \dfrac{U_1}{R_2} + C_1 \dfrac{dU_1}{dt} \\ I = \dfrac{U_2}{R_2} + C_2 \dfrac{dU_2}{dt} \end{cases} \quad (1)$$

In which, $U_{oc}$, represents the open-circuit voltage of a power supply, $R_0$ represents the ohmic internal resistance of the battery, $R_1$ represents an electrochemical polarization internal resistance, $R_2$ represents a concentration difference polarization internal resistance, $C_1$ represents an electrochemical polarization capacitance, $C_2$ represents a concentration difference polarization capacitance, $U_t$ represents a terminal voltage, I represents the current, $U_1$, $U_2$ respectively represents two loop terminal voltages of the capacitors, $C_1$, $C_2$.

In particular, the measured SOC value may be determined by an ampere-hour integration method:

$$SOC(t) = SOC(t_0) - \frac{\eta}{Q_C} \int_{t_0}^{t} I dt \quad (2)$$

in which, $t_0$ is the discharge start time, t is the current time, $\eta$ is the Coulomb efficiency, $\eta$ is the ratio of discharge capacity to charge capacity of the battery, and $Q_c$ indicates the rated capacity of the battery.

In the Step 3, before the parameter identification, discretizing the state equation and the output equation, specifically:
  in order to facilitate the application of the SOC algorithm, the model needs to be discretized, the following is a discrete form of the equivalent circuit model derived by utilizing the second-order RC equivalent circuit model; through the discretizing of the equation, the state equation of the equivalent circuit model can be obtained as follows:

$$\begin{bmatrix} U_1(k) \\ U_2(k) \\ SOC(k) \end{bmatrix} = \begin{bmatrix} e^{-\frac{T_s}{R_1 c_1}} & & \\ & e^{-\frac{T_s}{R_2 c_2}} & \\ & \Box & 1 \end{bmatrix} \times \begin{bmatrix} U_1(k-1) \\ U_2(k-1) \\ SOC(k-1) \end{bmatrix} + \begin{bmatrix} R_1\left(1 - e^{-\frac{T_s}{R_1 C_1}}\right) \\ R_2\left(1 - e^{-\frac{T_s}{R_2 C_2}}\right) \\ \frac{T_s}{Q_c} \end{bmatrix} \times I(k-1) + \omega(k) \quad (3)$$

Where $T_S$ is the sampling time; $\omega(k)$ is the process noise, obeying the Gaussian distribution whose mean is zero and covariance is Q(k); K is the measurement time, representing the measurement value when the time is k as a subscript.

The output equation after discretization of the second-order RC equivalent circuit model is as follows:

$$U_t(k) = U_{oc}(SOC(k)) - R_0 I(k) - U_1(k) - U_2(k) + v(k) \quad (4)$$

in which, $U_t(k)$ is the output terminal voltage, v(k) is the observation noise, $U_1(k)$ and $U_2(k)$ are the voltages of the two RC links respectively, $U_{oc}$ is the open-circuit terminal voltage of the power supply, and I is the charging and discharging current.

According to the first preferred embodiment, the internal parameters of the battery is identified basically by the finite memory incorporated variable forgetting factor recursive least squares algorithm, so that the problem of data saturation of historical data accumulated by the recursive least squares algorithm is well avoided and the accuracy of the final parameter identification result is improved.

Optionally, before the parameter identification, the SOC estimation method further includes a step of determining a relationship between the parameter to be identified and an output quantity according to the second-order RC equivalent circuit model constructed, which includes the following steps:
  Step 31: in view of the second-order RC equivalent circuit model established, obtaining a transfer function of the SOC estimation system through a Laplace transformation;
  firstly, performing the Laplace transformation on the equation (1) to obtain:

$$U_{oc}(s) - U_f(s) = I(s)\left(R_0 + \frac{R_1}{1 + R_1 C_1 s} + \frac{R_2}{1 + R_2 C_2 s}\right) \quad (5)$$

in which, S is the transformation parameter in Laplace transformation, S field represents the continuous spectrum relation, $U_{oc}(s)$ is the open end voltage of the power supply under Laplace transformation, and $U_f(s)$ is the output end voltage under Laplace transformation; the transfer function of the SOC estimation system being:

$$G(s) = \frac{U_{oc}(s) - U_t(s)}{I(s)} = R_0 + \frac{R_1}{1 + \tau_1 s} + \frac{R_2}{1 + \tau_2 s} = \frac{aR_0 s^2 + ds + c}{as^2 + bs + 1} \quad (6)$$

$$\begin{cases} \tau_1 = R_1 C_1, \tau_2 = R_2 C_2 \\ a = \tau_1 \tau_2 \\ b = \tau_1 + \tau_2 \\ c = R_0 + R_1 + R_2 \\ d = (R_0 + R_1)\tau_2 + (R_0 + R_2)\tau_1 \end{cases} \quad (7)$$

Step 32, discretizing the transfer function by utilizing a bilinear transformation method, and constructing a relationship between a parameter vector to be identified and a system output by taking open-circuit voltage and terminal voltage as an output of the system and taking a current value as an input value of the system;

$$\text{Order: } s = \frac{2}{T_S} \frac{1 - z^{-1}}{1 + z^{-1}}, \text{ can get}$$

$$G(z^{-1}) = \frac{U(z^{-1})}{I(z^{-1})} = \frac{\theta_3 + \theta_4 z^{-1} + \theta_5 z^{-2}}{1 - \theta_1 z^{-1} - \theta_2 z^{-2}} \quad (8)$$

in which, z is a complex variable in a bilinear transformation, which has a real part and an imaginary part, usually expressed in terms of polar coordinates, and the z filed represents a spectrum relationship of the signal after discretization.

Where $\theta_1$ to $\theta_5$ is expressed as follows:

$$\begin{cases} \theta_1 = \frac{8a - 2T_S^2}{4a + 2bT_S + T_S^2} \\ \theta_2 = \frac{2bT_S - 4a - T_S^2}{4a + 2bT_S + T_S^2} \\ \theta_3 = -\frac{4aR_0 + 2dT_S^2 + cT_S^2}{4a + 2bT_S + T_S^2} \\ \theta_4 = \frac{8aR_0 - 2cT_S^2}{4a + 2bT_S + T_S^2} \\ \theta_5 = -\frac{4aR_0 - 2dT_S + cT_S^2}{4a + 2bT_S + T_S^2} \end{cases} \quad (9)$$

in which, $T_S$ is the sampling time, $R_0$ is the ohmic internal resistance, and the values of a, b, c and d are shown in Equation (7).

Taking the power supply open-circuit voltage and the output terminal voltage as the output of the system and the current value as the input value of the system, the above equation is converted into the difference equation to obtain:

$$U(k) = \theta_1 U(k-1) + \theta_2 U(k-2) + \theta_3 I(k) + \theta_4 I(k-1) + \theta_5 I(k-2) \quad (10)$$

Order:

$$\varphi(k) = [U(k-1), U(k-2), I(k), I(k-1), I(k-2)]^T;$$

$$\hat{\theta} = [\theta_1, \theta_2, \theta_3, \theta_4, \theta_5]^T;$$

the relationship between the parameter vector to be identified and the system output is the output equation, and the equation (10) can be expressed as:

$$U(k) = \varphi^T(k)\hat{\theta} \quad 11$$

in which, $\varphi(k)$ is an information vector composed of input and output data, and $\hat{\theta}$ is a parameter vector to be identified by the battery system.

In the above first preferred embodiment, a relationship between the output terminal voltage and the parameters to be identified in the second-order RC equivalent circuit model is constructed, which is introduced into the finite memory incorporated variable forgetting factor recursive least square algorithm, and is continuously iterated, so that parameter values being identified can be obtained, the influence of old data on the identification result is eliminated, and the estimation accuracy of the SOC is further improved.

In the Step 3, the finite memory window is incorporated in the variable forgetting factor recursive least squares algorithm; through setting and storing a memory length j of the observed data during each parameter identification, latest N groups of the observed data are used in the parameter identification process. When a group of new data appears, an earliest group of observed time data is discarded correspondingly, and that, though adjusting a N value, the parameter identification accuracy is improved and the influence of the old data on an identification result is eliminated, wherein N is an integer greater than zero.

The parameters to be identified by the second-order RC equivalent circuit model are: Ohmic internal resistance R0, capacitors C1 and C2, resistors R1 and R2, and each of the parameters to be identified is identified and obtained by the finite memory incorporated variable forgetting factor recursive least squares algorithm under a HPPC test.

The observed data obtained through the HPPC test include battery voltage and current data, wherein the change of voltage, power, energy and the like along with the current is observed through the change of the current. The specific HPPC test process includes steps of:

(1) setting a temperature of an incubator to 25° C., placing the lithium battery in an environment (the incubator) with constant temperature of 25° C., and fully charging the lithium battery in a constant-current and constant-voltage mode, wherein the SOC in the fully charged state is 100%;

(2) discharging the lithium battery by using a constant flow of 1 C current, wherein the SOC is 90% after the continuously set discharging time;

wherein, 1 C in a constant current, C represents a battery charging and discharging capacity rate, and 1 C represents that the lithium battery is stably discharged at a discharge rate of one time;

(3) allowing the lithium battery to stand for 1 hour to stabilize the chemical reaction inside the battery;

(4) cycling the steps (2) to (3) until the lithium battery is discharged;

wherein, specifically, the SOCs are decremented by cycling the steps (2) and (3) for 9 times, and the SOCs are respectively 80%, 70%, . . . and 0%; and (5) saving HPPC experimental data.

For a 18650 type single ternary lithium battery, the set discharge time is 6 minutes, and specific parameters of the single battery are shown in Table 1 below:

TABLE 1

Parameters of Ternary Lithium Battery

| Project | Parameter |
| --- | --- |
| Nominal Capacity | 3500 mA |
| Nominal Voltage | 3.7 V |
| Charge Cutoff Voltage | 4.2 V |
| End-Off Voltage | 2.75 V |

Through the above HPPC test method, the obtained battery voltage and current data are carried into the finite memory incorporated variable forgetting factor recursive least squares algorithm, and each parameter value of the equivalent circuit model can be obtained.

In particular, an equation derivation process of the finite memory incorporated variable forgetting factor recursive least squares algorithm is as follows:

introducing new data into the algorithm, wherein the equation for introducing new data is as follows:

$$\begin{cases} e_{k-1+j} = y_{k-1+j} - h_{k-1+j}^T \hat{\theta}_{k-1,k-2+j} \\ \lambda_{k-1+j} = 1 - \dfrac{e_{k-1+j}^2}{1 + h_{k-2+j}^T P_{k,k-2+j} h_{k-2+j}} \\ K_{k-1,k+j} = 1 - \dfrac{P_{k,k-2+j} h_{k-1+j}}{\lambda_{k-1+j} + h_{k-1+j}^T P_{k,k-2+j} h_{k-1+j}} \\ \hat{\theta}_{k-1,k+j} = \hat{\theta}_{k,k-2+j} + K_{k-1,k+j} e_{k-1+j} \\ P_{k-1,k+j} = \dfrac{I + K_{k-1,k+j} h_{k-1+j}^T}{\lambda_{k-1+j}} P_{k,k-2+j} \end{cases} \quad (12)$$

in which, e is the vector equation error, representing the difference between the actual observation value and the current prediction value, that is, the prediction error at the current time; λ is the forgetting factor of the forgetting factor recursive least squares algorithm; K is the correction weight value; $\hat{\theta}$ is the optimal estimate of the parameter to be identified before decoding; P is the covariance matrix; k in the subscript represents the k time; j is the memory length; $h_k$ represents the observation vector of the kth input and output.

Since the set data storage capacity is limited, the addition of new data results in a removal of some old data, and the equation is derived as follows:

$$\begin{cases} e_{k+j} = y_{k+j} - h_{k-j}^T \hat{\theta}_{k,k-1+j} \\ \lambda_{k+j} = 1 - \dfrac{e_{k+j}^2}{1 + h_{k-1+j}^T P_{k,k-1+j} h_{k-1+j}} \\ K_{k,k+j} = 1 - \dfrac{P_{k,k-1+j} h_{k+j}}{\lambda_{k+j} + h_{k+j}^T P_{k,k-1+j} h_{k+j}} \\ \hat{\theta}_{k,k+j} = \hat{\theta}_{k,k-1+j} + K_{k,k+j} e_{k+j} \\ P_{k,k+j} = \dfrac{I + K_{k,k+j} h_{k+j}^T}{\lambda_{k+j}} P_{k,k-1+j} \end{cases} \quad (13)$$

in which, $\lambda_{k+L}$ is the variable forgetting factor update equation and j is the memory length.

Further, the memory length for the battery type selected in the test example may be within a range of 1200-1600, and preferably, the memory length is set to 1500.

Let the parameter vector of the kth parameter identification be:

$$\hat{\theta} = [\hat{\theta}_1(k), \hat{\theta}_2(k), \hat{\theta}_3(k), \hat{\theta}_4(k), \hat{\theta}_5(k)]^T;$$

the following parameters can be derived by combining the equation (6):

$$R_0(k) = \dfrac{\hat{\theta}_3(k) - \hat{\theta}_4(k) + \hat{\theta}_5(k)}{1 + \hat{\theta}_1(k) + \hat{\theta}_2(k)} \quad (14)$$

$$\begin{cases} a_k = \dfrac{T^2}{4} \dfrac{1 + \hat{\theta}_1(k) - \hat{\theta}_2(k)}{1 - \hat{\theta}_1(k) - \hat{\theta}_2(k)} \\ b_k = T \dfrac{1 + \hat{\theta}_2(k)}{1 - \hat{\theta}_1(k) - \hat{\theta}_2(k)} \\ c_k = \dfrac{\hat{\theta}_3(k) + \hat{\theta}_4(k) + \hat{\theta}_5(k)}{1 - \hat{\theta}_1(k) - \hat{\theta}_2(k)} \\ d_k = T \dfrac{\hat{\theta}_3(k) - \hat{\theta}_5(k)}{1 - \hat{\theta}_1(k) - \hat{\theta}_2(k)} \end{cases} \quad (15)$$

After sorting, the parameters to be identified can be obtained:

$$\begin{cases} \tau_1(k) = \dfrac{b_k - \sqrt{b_k^2 - 4a_k}}{2} \\ \tau_2(k) = \dfrac{b_k + \sqrt{b_k^2 - 4a_k}}{2} \end{cases} \quad (16)$$

$$\begin{cases} R_1(k) = \dfrac{R_0(k)\tau_2(k) + c_k\tau_1(k) - d_k}{\tau_1(k) - \tau_2(k)} \\ R_2(k) = \dfrac{d_k - R_0(k)\tau_1(k) - c_k\tau_2(k)}{\tau_1(k) - \tau_2(k)} \\ C_1(k) = \dfrac{\tau_1(k)}{R_1(k)} \\ C_2(k) = \dfrac{\tau_2(k)}{R_2(k)} \end{cases} \quad (17)$$

In the observed data obtained under the IPPC test, the method for obtaining the parameters to be identified by the finite memory incorporated variable forgetting factor recursion least squares algorithm includes steps of:

step (1): setting initial conditions, setting an identification parameter as a real column vector, setting a memory length of a storage queue for storing observed data, acquiring the observed data, and storing the observed data in the storage queue according to an observation time sequence;

wherein the data stored in the storage queue is time-dependent and can correspond to the experimental process of sequentially decreasing the SOCs in the HPPC experimental data;

and specifically, setting $\hat{\theta}(0,0)$ is a sufficiently small real column vector, $P(0,0)=\delta I$ (δ is a sufficiently large real number, I is an identity matrix), and setting the memory length is j;

step (2): selecting an earliest group of data in the storage queue, solving the output equation of the equation (11) by utilizing the finite memory incorporated variable forgetting factor recursive least squares algorithm to obtain a primary identification parameter, that is, $\hat{\theta}(0, L-1)$ and $P(0, L-1)$, as an initial parameter of the finite memory incorporated variable forgetting factor recursive least squares algorithm;

step (3): according to the output equation of the equation (11) and the initial parameter, obtaining a calculation result $\hat{\theta}_k$ by utilizing the variable forgetting factor recursive least squares algorithm according to residual observed data in the storage queue;

step (4): according to the current identification result $\hat{\theta}_k$, obtaining the parameters $R_0(k)R_1(k)R_2(k)C_1(k)C_2(k)$ of the kth time of the second-order equivalent circuit model;

step (5): receiving new observed data and removing old observed data based on the set equation, and updating the observed data in the storage queue; and repeating the step (2) to step (5) until all the observed data are processed to obtain a final identification result;

wherein, specifically, the equations (12) and (13) are respectively used for receiving new data and removing old data.

According to the first preferred embodiment, in order to explain the parameter identification effect, the memory length j is preferred to be set to 1500 for best effect after being verified by comparing multiple groups of tests, wherein the memory length can effectively cut off the influence of the historical data and does not affect the estimation accuracy.

In the first preferred embodiment, by setting the identification processing length of the observed data, the influence of the old data of the recursive least squares algorithm on the parameter identification result is eliminated through the finite memory, and the identification accuracy of each parameter in the equivalent circuit model is improved.

Figure 3:
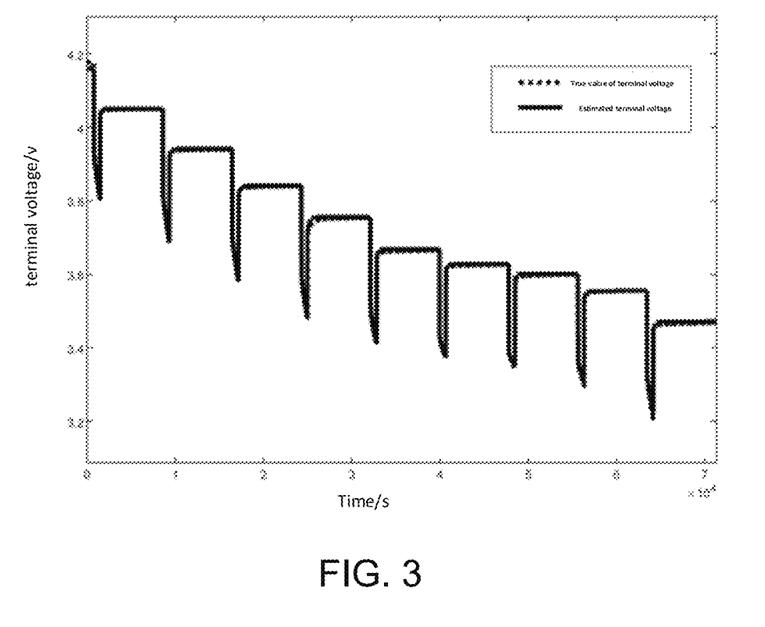
FIG. 3 is a graph showing the comparison between the terminal voltage of the equivalent circuit model and the true value obtained after obtaining the parameter identification result in the test in the above first preferred embodiment of the present invention.
Figure 4:
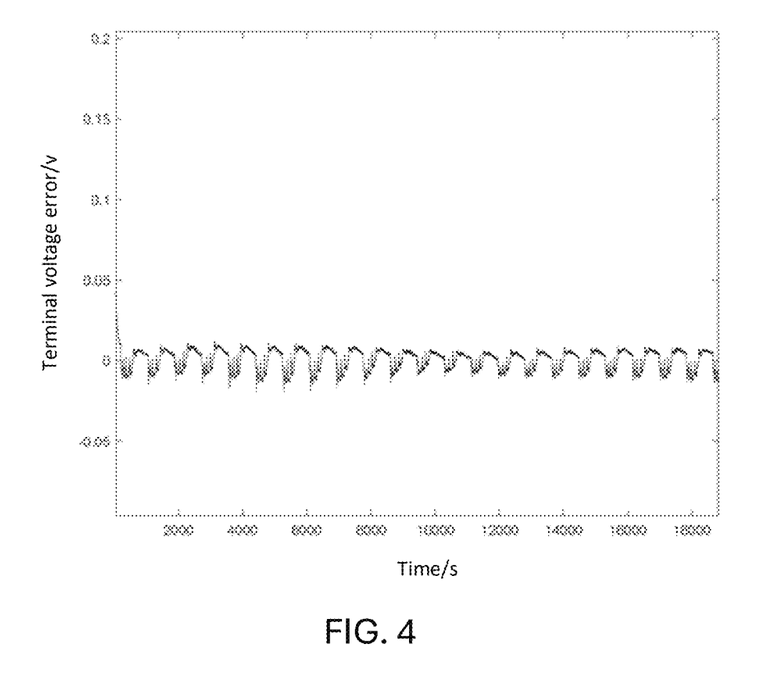
FIG. 4 is an error value graph of the equivalent circuit model obtained after obtaining the parameter identification result in the test in the above first preferred embodiment of the present invention.

After the parameter identification result is obtained, results as shown in FIG. 3 and FIG. 4 can be obtained. In which, FIG. 3 is a comparison graph of the value of the estimated terminal voltage with the true value of the terminal voltage. From the graph, it shows that the fitting effect of the variable forgetting factor recursive least squares algorithm incorporating the finite memory on the parameter is significant, and the fitting effect is good at both higher and lower terminal voltages. FIG. 4 is an error value graph for estimating the terminal voltage. It can be obtained from FIG. 4 that the terminal voltage error can be always maintained within an absolute value of 0.03, and the average absolute error and root mean square error estimated by the algorithm program are 0.43% and 0.66%, respectively. In conclusion, the parameter identification method can obtain relatively more accurate parameter identification results, and lays a foundation for identifying an accurate battery SOC value.

The electrochemical reaction process of the lithium battery is complex, with many influencing factors and uncertainty. Its algorithm research has been a multi-domain and multi-discipline problem and is also a key and difficult point of SOC research of the lithium battery.

For the lithium battery, the parameters obtained through identification have a strong nonlinear relationship, and the parameters and the noise probability distribution of the lithium battery are unknown under different working conditions. In view of the above problems of the lithium battery, the adaptive unscented H infinite filtering algorithm (AFOUHF) based on the second-order equivalent circuit model is utilized on the basis of obtaining the identification parameters through the limited memory variable forgetting factor recursive least squares algorithm that limits the memory variable forgetting factor while the main framework of the adaptive unscented H infinite filtering algorithm is an unscented Kalman filtering algorithm (UKF). To the problem that the statistical characteristic of observed noise of the UKF algorithm must be assumed to white noise, through the introduction of the H infinite filtering algorithm, the non-Gaussian noise is filtered by minimizing the cost function, so that the accuracy of algorithm prediction is improved, and through the introduction of the adaptive part, the robustness of the algorithm is enhanced.

In the step (4), the second-order RC equivalent circuit model of known element parameters is obtained through a parameter identification step, namely a SOC estimation model, which is solved by utilizing an AFOUHF algorithm to estimate the value of the SOC, including specific steps of:

step (41): initializing a SOC estimation, and assigning a default initial value to a state variable;

wherein, before the algorithm starts, setting an initial error $x_0$ and a covariance $P_0$, wherein the state variable x represents the input vector $U_1$, $U_2$ in the state space expression and the value of the SOC in the system;

$$\hat{x}_0^+ = E(x_0), P_0^+ = E[(x_0 - \hat{x}_0^+)(x_0 - \hat{x}_0^+)^T] \quad (18)$$

in which, $\hat{x}_0^+$ represents the $x_0^+$ initial estimate before any measurement is not used, $E(x_0)$ represents the x expected value at time $x = x_0$, and $P_0^+$ represents the covariance of the estimation error at the initial time;

according to the first preferred embodiment, the known quantity being the parameter identification result of each element (each of the resistors and the capacitors) in the second-order RC equivalent circuit model;

step (42): performing state estimation at the time k−1, generating a set of sigma points of the state variable, and calculating corresponding weight values of sampling points:

$$\begin{cases} w_0^m = \dfrac{\psi}{L+\psi} \\ w_0^c = \dfrac{\psi}{L+\psi} + (1-\alpha^2+\beta) \\ w_i^m = w_i^c = \dfrac{\eta}{2(L+\eta)}, i=1,\ldots,2L \end{cases} \quad (19)$$

$$\begin{cases} \hat{x}_{k-1}^{(0)} = \hat{x}_{k-1} \\ \hat{x}_{k-1}^{(i)} = \hat{x}_{k-1} + \left(\sqrt{(L+\psi)P_{k-1}}\right), i=1,\ldots,L \\ \hat{x}_{k-1}^{(i)} = \hat{x}_{k-1} - \left(\sqrt{(L+\psi)P_{k-1}}\right), i=L+1,\ldots,2L \end{cases} \quad (20)$$

in which, $w^m$ and $w^c$ represent the corresponding weights, while each $\Psi$ is the adjustment parameter; a is a sigma-point scaling parameter to minimize possible higher-order effects; $\beta$ is a non-negative weight term used to adjust the weight of the covariance of the 0th sigma point; L is the dimension of the state vector, wherein $\{x_{k-1}^j, i=0,1,\ldots,2L-1\}$ is a series of 2L+1 sampling points calculated from the state estimation at time k−1, $\{w_i^m, i=0,1,\ldots,2L+1\}$ is a set of weights for the state mean estimation, and $\{w_i^c, i=0,1,\ldots,2L+1\}$ is a set of weights for the state covariance estimation.

wherein, according to the first preferred embodiment, the L value is taken as 4, and 2L+1 represents the number of sigma point sets;

optionally, according to the first preferred embodiment, the $\alpha$ value is 1, and the $\beta$ value is 2;

in the step (42), the fixed value of the input vector at a certain time being selected as the input, and the corresponding weight value being obtained;

step (43): performing a time updating, wherein the expected value of the prior state estimation variable $\hat{x}_k^-$ and the corresponding error covariance matrix $P_k^-$ is calculated based on the state variable. $\hat{x}_1^+, \ldots, \hat{x}_{k-1}^+$;

$$\hat{x}_k^{(i)} = f\left(\hat{x}_{k-1}^{(i)}, u_{k-1}\right) \quad (21)$$

-continued $$\hat{x}_k^- = \sum_{i=0}^{2L} \omega_i^{(m)} \hat{x}_k^{(i)} \qquad (22)$$

$$P_k^- = \sum_{i=0}^{2L} w_i^{(c)} \left(\hat{x}_k^{(i)} - \hat{x}_k^-\right)\left(\hat{x}_k^{(i)} - \hat{x}_k^-\right)^T + Q_k \qquad (23)$$

in which, f(·) represents the nonlinear system equation, converting the sigma point to $\hat{x}_k^{(i)}$; $\hat{x}_k^-$ represents the prior state estimate of the k time obtained by the merging vector $\hat{x}_k^{(i)}$; $P_k^-$ is the prior estimate of the covariance; $Q_k$ is the process noise, as shown in step (21); the sigma point $\{\hat{x}_{k-1}^{(i)}, i=0,1,\ldots,2L+1\}$ of the k−1 time is obtained by the time update of the state function f and the sigma point $\{\hat{x}_k^{(i)}, i=0,1,\ldots,2L+1\}$ of the k time;

wherein the step (43) is to recalculate an expected value and covariance using a different time scale;

wherein the above step (41) to step (43) are identical to the existing UKF algorithm;

step (44): updating the measurement to calculate an output prediction value $\hat{y}_k$ and a corresponding covariance matrix: $P_{y,k}$, $P_{xy,k}$:

$$\hat{y}_k^i = g\left(\hat{x}_k^{(i)}, u_k\right) \qquad (24)$$

$$\hat{y}_k = \sum_{i=0}^{2L} w_i^m \hat{y}_k^i \qquad (25)$$

$$P_{y,k} = \sum_{i=0}^{2L} w_i^c \left(\hat{y}_k^i - \hat{y}_k\right)\left(\hat{y}_k^i - \hat{y}_k\right)^T \qquad (26)$$

$$P_{xy,k} = \sum_{i=0}^{2L} w_i^c \left(\hat{x}_k^{(i)} - \hat{x}_k^-\right)\left(\hat{y}_k^i - \hat{y}_k\right)^T \qquad (27)$$

in the equation, the sigma point being converted into $\hat{y}_k^i$, and the combined vector $\hat{y}_k^i$ being obtained $\hat{y}_k$ by using the known nonlinear measurement equation g(·), $P_{y,k}$ as the calculated output prediction value, which $P_{xy,k}$ is the covariance of estimation prediction, $\hat{x}_k^-$ and $\hat{y}_k$ being the covariance between the estimation sum;

based on the time-updated expected value and covariance, the output predicted value and covariance being measured and updated; based on different time scales, sequentially and iteratively calculating the output predicted value and covariance matrix;

step (45): modifying a posterior state estimation value based on the covariance matrix of the output prediction value $\hat{x}_k^+$ to obtain a modified SOC prediction estimation value;

$$K_k = P_{xy,k}(P_{yy,k} + R_k)^{-1} \qquad (28)$$

$$\hat{x}_k^+ = \hat{x}_k^- + K_k(y_k - \hat{y}_k^-) \qquad (29)$$

$$P_K = P_k^- - [P_{xy,k} \ P_k^-]R_{e,k}^-[P_{xy,k} \ P_k^-]^T \qquad (30)$$

$$R_{e,k} = \begin{bmatrix} R + P_{xy,k} & (P_{xy,k})^T \\ P_{xy,k} & \gamma^2 I + P_k^- \end{bmatrix} \qquad (31)$$

in which, $K_k$ is Kalman gain, $P_K$ is posteriori covariance estimation, and $R_k$ is measurement noise;

in this step (45), a prior estimate being known, and a posteriori estimate being obtained by adjusting the parameter and the Kalman gain.

The above range of $\gamma^2$ based on the second-order equivalent circuit model needs to be deduced and determined, which $\gamma^2$ is the set performance boundary. If its value is too small, it may lead to instability of the solution of equation (30), and finally result in divergence of the filter. If its value is too large, it may affect the estimation performance. Therefore, selecting an appropriate parameter is the core problem of the algorithm. The $\gamma^2$ is determined as follows:

according to the characteristics of the state equation of the lithium battery, the following equation (32) can be obtained by taking the equation (23) into the equation (30) and inverting the equation:

$$(P_k^+)^{-1} = (P_k^-)^{-1} - \gamma^{-2}I + (P_k^-)^{-1}P_{xy,k}R^{-1}[(P_k^-)^{-1}P_{xy,k}]^T \qquad (32)$$

Since $P_k^+$ is symmetric and positive definite, the above expression shall be greater than 0, and it can be obtained as follows:

$$(P_k^-)^{-1} + (P_k^-)^{-1}P_{xy,k}R^{-1}[(P_k^-)^{-1}P_{x,k}]^T > \gamma^{-2}I \qquad (33)$$

$\gamma^{-2}$ can be regarded as the characteristic value of the equation on the left side of the above equation, so:

$$\gamma^2 > \alpha \max\{\text{eig}((P_k^-)^{-1} + (P_k^-)^{-1}P_{xy,k}R^{-1}[(P_k^-)^{-1}P_{xy,k}]^T)^{-1}\} \qquad (34)$$

$\gamma^2$ the maximum characteristic value can be obtained by the following equation:

$$\gamma^2 = \beta\max\{\text{eig}((P_k^-)^{-1} + (P_k^-)^{-1}P_{xy,k}R^{-1}[(P_k^-)^{-1}P_{xy,k}])^{-1}\} \qquad (35)$$

The function of $\gamma^2$ has the same function as the cost function in the H-infinity algorithm. By adjusting $\gamma^2$, the cost function in the H-infinity algorithm can achieve the same effect as the cost function in the H-infinity algorithm; adjusting $\gamma^2$ through the H-infinity algorithm can improve the robustness to non-Gaussian noise, and at the same time can correct the ill-conditioned matrix when calculating the covariance matrix. When $\gamma^2$ tends to infinity, FOUHF is equivalent to FOUKF.

FOUHF algorithm is obtained by combining unscented Kalman filter algorithm with H infinite filter algorithm. If $\gamma^2$ approaches infinity, the combined algorithm is the same as unscented Kalman algorithm (FOUKF), where β not less than 1.

In the Step 5, through adjusting the noise coefficients through the adaptive algorithm, the on-line estimation of the SOC is accomplished:

after correcting the posterior state estimation value, adding an adaptive algorithm to correct the noise covariance matrixes Q and R, and specifically, updating the noise coefficients $Q_k$ and $R_k$ by calculating the covariance of the terminal voltage difference, as follows:

$$\Delta U_k = U_k - \left[m_0 + R_0 i_k + \frac{m_1}{z_k} - m_2 z_k - m_3 \ln(z_k) - m_4 \ln(1-z_k)\right] \qquad (36)$$

$$F_k \approx \frac{\sum_{n=k-L+1}^{k} \Delta U_n \Delta U_n^T}{L} \qquad (37)$$

$$Q_k = K_k F_k K_k^T \qquad (38)$$

$$R_k = F_k + \sum_{i=0}^{2n_x} w_i^c \left(\hat{y}_k^i - U_k + \Delta U\right)\left(\hat{y}_k^i - U_k + \Delta U\right)^T \qquad (39)$$

wherein $\Delta U$ is the output terminal voltage error value of model k, $\Delta U_n$ is the cumulative sum of n terms; $z_k$ is the SOC of the battery, $F_k$ is the approximation of the covariance of the terminal voltage error of the equivalent model k, wherein the noise coefficients $Q_k$ and $R_k$ are updated by obtaining the covariance of the terminal voltage difference, and the noise coefficients $Q_k$ and $R_k$ are adjusted through continuous iteration to get the accurate SOC estimation value; $m_0$, $m_1$, $m_2$, $m_3$, $m_4$ are the coefficients of the expression for the error value of the voltage at the output, respectively.

In order to verify the accuracy and stability of the 2RC-AFOUHF algorithm, a complex dynamic stress test condition (DST) is utilized in the first preferred embodiment, a lithium battery pack test condition (BBDST) under a public transportation condition is selected to test the battery, and the initial value of the SOC is set to be 70% under the condition.

Figure 5:
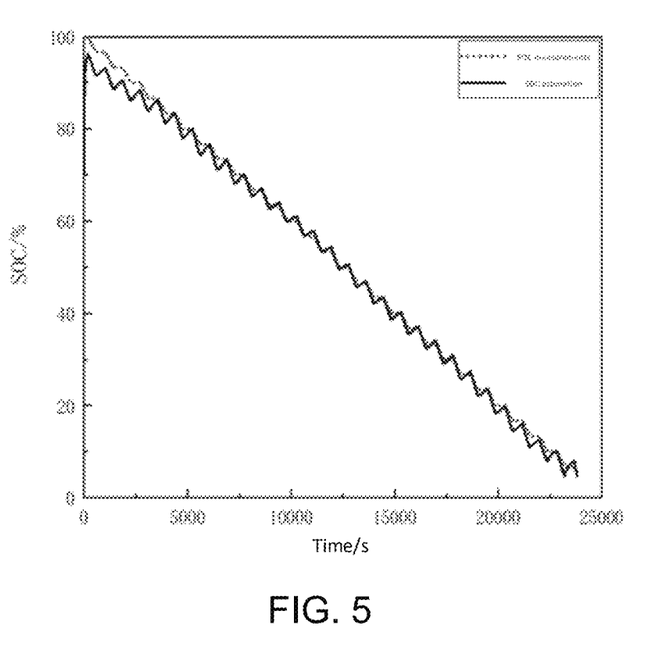
FIG. 5 is a comparison chart of SOC measured values and estimated values in the test according to the above first preferred embodiment of the present invention.
Figure 6:
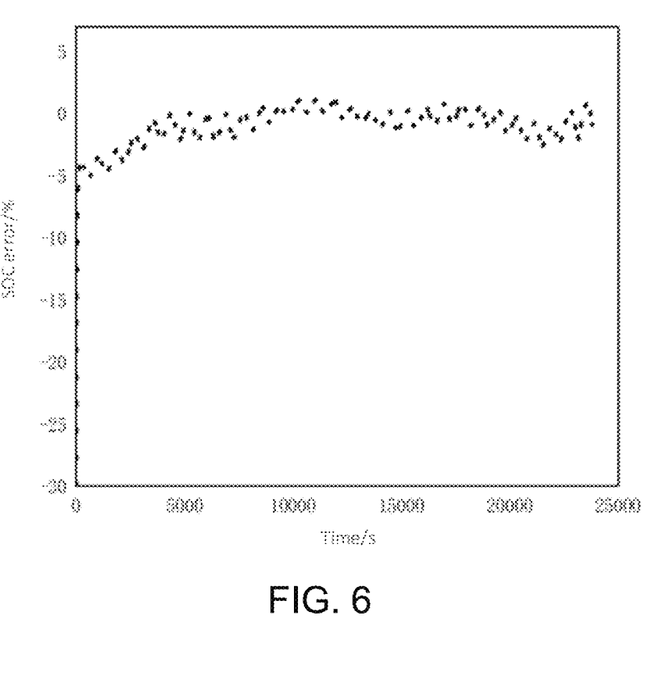
FIG. 6 is a graph showing the estimation result error of the SOC under the BBDST condition in the test according to the above first preferred embodiment of the present invention.

According to the above SOC estimation algorithm, the fitting graph of the SOC measurement value and the estimated value as shown in FIG. 5 is obtained, in which even if the initial SOC is set to 70%, and the deviation from the true value 100% is far, so that the algorithm also has a good error correction capability and has excellent convergence fitting performance. The average absolute error and the mean square error of the 2RC-AFOUHF algorithm estimation as shown in FIG. 6 are 0.44% and 0.58%, respectively, which mean absolute error and mean square error are low.

In view of above, through collecting the voltage and current information of the lithium battery in real time, an online parameter identification is performed by utilizing the finite memory incorporated variable forgetting factor recursive least squares algorithm, and that the adaptive unscented H infinite filtering algorithm is combined to estimate the SOC of the lithium battery in real time, so that the accuracy of SOC value estimation is greatly improved.

Second Embodiment

Based on the above first preferred embodiment, the second preferred embodiment provides a SOC estimation system for improving fusion of parameter identification and infinity algorithm, including:
  a model construction module configured to establish a second-order RC equivalent circuit model according to dynamic and static characteristics of a battery;
  a computation module configured to calculate a state equation and an output equation based on the second-order RC equivalent circuit model being established;
  a parameter identification module configured to identify parameters (resistance and capacitance values) of elements of the second-order RC equivalent circuit model, using the output equation and the state equation calculated, by configuring with the variable forgetting factor recursive least squares algorithm incorporating a finite memory window;
  a SOC estimation module established by combining an adaptive unscented H infinite filtering algorithm with the second-order RC equivalent circuit model with the parameters identified to obtain a SOC prediction estimation value; and
  a correction module configured to correct the SOC prediction estimation value by adjusting one or more noise coefficients through the adaptive unscented H infinite filtering algorithm to obtain a SOC estimated value.

It is worth mentioning that the modules in the second preferred embodiment are in one-to-one correspondence with the steps in the above first preferred embodiment, and the implementation process is the same, which is not described herein again.

Third Embodiment

The third preferred embodiment provides an electronic device comprising a memory unit configured to store computer instructions and a processor configured to process the computer instructions to execute the steps described in the SOC estimation method of the above first preferred embodiment.

Fourth Embodiment

The fourth preferred embodiment provides A computer readable storage medium for storing computer instructions which, when executed by a processor, executes the steps described in the SOC estimation method of the above first preferred embodiment.

The above description is only of the preferred embodiments of the present invention and is not intended to limit the present invention, but various modifications and variations can be made to the present invention by those skilled in the art. Any modification, equivalent replacement, improvement, etc. made within the spirit and principle of the present invention should be included in the protection scope of the present invention.

What is claimed is:

1. A non-transitory computer readable storage medium storing instruction that, when executed by a processor of a battery management system of an electric vehicle, cause the processor to perform a method for estimating a state of charge (SOC) of a battery of the electric vehicle, the method comprising steps of:
  (a) collecting real-time voltage and current information of the battery and establishing a second-order RC (Resistor-Capacitor) equivalent circuit model implemented in the non-transitory computer readable medium, using the real-time voltage and current information collected, to represent dynamic and static characteristics of the battery;
  (b) calculating a state equation and an output equation of the second-order RC equivalent circuit model being established, wherein the state equation and the output equation are continuously update in real time in response to changing battery conditions dynamically within the computer processor of the non-transitory computer readable medium;
  (c) performing a parameter identification using the output equation and the state equation calculated by configuring with a variable forgetting factor recursive least squares (VFF-RLS) algorithm incorporating a finite memory window, and obtaining parameters of elements of the second-order RC equivalent circuit model;
  (d) combining an adaptive unscented H infinite (H∞) filtering algorithm with the second-order RC equivalent circuit model with the parameters obtained to establish a SOC estimation model and to obtain a SOC predication estimation value; and
  (e) correcting the SOC predication estimation value by adjusting one or more noise coefficients through the adaptive unscented H infinite filtering algorithm to obtain a SOC estimated value being displayed on the battery management system, that reflects a state information of the battery to accurately respond to a status information of the battery and accurately estimate the SOC value of the battery of the electric vehicle, so as to manage and control the battery within a safe and reliable working range to improve the vehicle performance and prolong a life span of the battery;

wherein the step (e) includes updating the one or more noise coefficients by obtaining a covariance of the terminal voltage difference;

before the step (c), further including determining a relationship between the parameters to be identified and an output quantity according to the second-order RC equivalent circuit model being established, which includes steps of:

(c1) in view of the second-order RC equivalent circuit model, obtaining a system transfer function by a Laplace transformation; and (c2) discretizing the system transfer function by utilizing a bilinear transformation method, and constructing a relationship between a parameter vector to be identified and a system output by taking an open-circuit voltage and a terminal voltage as an output of the system and taking a current value as an input value of the system;

wherein the parameters to be identified are identified as observed data obtained by the variable forgetting factor recursive least squares algorithm incorporating finite memory under a Hybrid pulse power characterization (HPPC) test, including steps of:

step (1): setting initial conditions, setting an identification parameter as a real column vector, setting a memory length of a storage queue for storing the observed data, acquiring the observed data, and storing the observed data in the storage queue according to an observation time sequence;

step (2): selecting an earliest group of data in the storage queue, solving the output equation by utilizing the recursive least squares algorithm to obtain a primary identification parameter as an initial parameter of the variable forgetting factor recursive least squares algorithm incorporating finite memory;

step (3): according to the output equation and the initial parameter, obtaining a calculation result by utilizing the variable forgetting factor recursive least squares algorithm according to residual observed data in the storage queue;

step (4): according to a current identification result, obtaining the parameters of the second-order equivalent circuit model;

step (5): receiving new observed data and removing old observed data of the observed data based on one or more set equation, and updating the observed data in the storage queue; and repeating the step (2) to step (5) until all the observed data are processed to obtain a final identification result;

a relationship between an output terminal voltage and the parameters to be identified in the second-order RC equivalent circuit model being constructed, which is introduced into the incorporated variable forgetting factor recursive least square algorithm incorporating finite memory, and is continuously iterated, so that parameter values being identified are obtained for eliminating an influence of old data on the final identification result;

through incorporating the finite memory window in the variable forgetting factor recursive least squares algorithm, that is during each the parameter identification, setting a memory length for storing the observed data, latest N groups of the observed data are used in the parameter identification, when a group of new data appears, an earliest group of observed time data is discarded correspondingly, wherein N is an integer greater than zero;

an equation derivation of the variable forgetting factor recursive least squares algorithm incorporating finite memory being:

introducing new data into the variable forgetting factor recursive least squares algorithm through the following equation:

$$\begin{cases} e_{k-1+S} = y_{k-1+S} - h_{k-1+S}^T \hat{\theta}_{k-1,k-2+S} \\ \lambda_{k-1+S} = 1 - \dfrac{e_{k-1+S}^2}{1 + h_{k-2+S}^T P_{k,k-2+S} h_{k-2+S}} \\ K_{k-1,k+S} = \dfrac{P_{k,k-2+S} h_{k-1+S}}{\lambda_{k-1+S} + h_{k-1+S}^T P_{k,k-2+S} h_{k-1+S}} \\ \hat{\theta}_{k-1,k+S} = \hat{\theta}_{k,k-2+S} + K_{k-1,k+S} e_{k-1+S} \\ P_{k-1,k+S} = \dfrac{I + K_{k-1,k+S} h_{k-1+S}^T}{\lambda_{k-1+S}} P_{k,k-2+S} \end{cases}$$

in which, e is a vector equation error, representing a difference between an actual observation value and a current prediction value, that is, a prediction error at a current time; λ is a forgetting factor of the forgetting factor recursive least squares algorithm; K is a correction weight value; $\hat{\theta}$ is an optimal estimate of the parameters to be identified before decoding; P is a covariance matrix; k in a subscript represents a k time; j is the memory length; $h_k$ represents an observation vector of kth input and output;

since a set data storage capacity being limited, an addition of new data results in a removal of some old data, and the equation being derived as follows:

$$\begin{cases} e_{k-1+j} = y_{k-1+j} - h_{k-1+j}^T \hat{\theta}_{k-1,k-2+j} \\ \lambda_{k-1+j} = 1 - \dfrac{e_{k-1+j}^2}{1 + h_{k-2+j}^T P_{k,k-2+j} h_{k-2+j}} \\ K_{k-1,k+j} = \dfrac{P_{k,k-2+j} h_{k-1+j}}{\lambda_{k-1+j} + h_{k-1+j}^T P_{k,k-2+j} h_{k-1+j}} \\ \hat{\theta}_{k-1,k+j} = \hat{\theta}_{k,k-2+j} + K_{k-1,k+j} e_{k-1+j} \\ P_{k-1,k+j} = \dfrac{I + K_{k-1,k+j} h_{k-1+j}^T}{\lambda_{k-1+j}} P_{k,k-2+j} \end{cases}$$

in which, $\lambda_{k+L}$ is a variable forgetting factor update equation and j is the memory length;

the one or more noise coefficients $Q_k$ and $R_k$ being updated by calculating a covariance of a terminal voltage difference as follows:

$$\Delta U_k = U_k - \left[ m_0 + R_0 i_k + \frac{m_1}{z_k} - m_2 z_k - m_3 \ln(z_k) - m_4 \ln(1 - z_k) \right]$$

$$F_k \approx \frac{\sum_{n=k-L+1}^{k} \Delta U_n \Delta U_n^T}{L}$$

$$Q_k = K_k F_k K_k^T$$

$$R_k = F_k + \sum_{i=0}^{2n_x} w_i^c (\hat{y}_k^i - U_k + \Delta U)(\hat{y}_k^i - U_k + \Delta U)^T$$

wherein ΔU is an output terminal voltage error value of model k, $\Delta U_n$ is a cumulative sum of n terms; $z_k$ is a SOC of the battery, $F_k$ is an approximation of a covariance of a terminal voltage error of the equivalent model k, wherein noise coefficients $Q_k$ and $R_k$ are updated by obtaining the covariance of the terminal voltage difference, and the one or more noise coefficients $Q_k$ and $R_k$ are adjusted through continuous iteration to get an accurate SOC estimation value; $m_0$, $m_1$, $m_2$, $m_3$, $m_4$ are coefficients of an expression for an error value of a voltage at the system output, respectively.

2. The non-transitory computer readable storage medium according to claim 1, wherein a main framework of the adaptive unscented H infinite filtering algorithm is an unscented Kalman filtering algorithm incorporating H infinite filtering algorithm by minimizing a cost function to filter non-Gaussian noise.

3. The non-transitory computer readable storage medium according to claim 1, wherein the step (d) of combining the adaptive unscented H infinite filtering algorithm with the second-order equivalent circuit model to establish the SOC estimation model further includes steps of:
- (d1) initializing a SOC estimation, and assigning a default initial value to a state variable;
- (d2) performing state estimation at a time k−1, generating a set of sigma points of the state variable, and calculating corresponding weight values of sampling points;
- (d3) performing a time updating, wherein an expected value of a prior state estimation variable and a corresponding error covariance matrix is calculated based on the state variable;
- (d4) updating a measurement to calculate an output prediction value and a corresponding covariance matrix; and
- (d5) modifying a posterior state estimation value based on the covariance matrix of the output prediction value to obtain a modified SOC prediction estimation value.

4. A battery management system of an electric vehicle for estimating a state of charge (SOC) of a battery of the electric vehicle, comprising:
- a non-transitory computer readable storage medium; and
- a processor configured to execute instructions stored in a non-transitory computer readable storage medium, wherein the instructions cause the processor to:
- (a) collecting real-time voltage and current information of the battery and establishing a second-order RC (Resistor-Capacitor) equivalent circuit model implemented in the non-transitory computer readable medium, using the real-time voltage and current information collected, to represent dynamic and static characteristics of the battery;
- (b) calculating a state equation and an output equation of the second-order RC equivalent circuit model being established, wherein the state equation and the output equation are continuously update in real time in response to changing battery conditions dynamically within the computer processor of the non-transitory computer readable medium;
- (c) performing a parameter identification using the output equation and the state equation calculated by configuring with a variable forgetting factor recursive least squares (VFF-RLS) algorithm incorporating a finite memory window, and obtaining parameters of elements of the second-order RC equivalent circuit model;
- (d) combining an adaptive unscented H infinite (H∞) filtering algorithm with the second-order RC equivalent circuit model with the parameters obtained to establish a SOC estimation model and to obtain a SOC predication estimation value; and
- (e) correcting the SOC predication estimation value by adjusting one or more noise coefficients through the adaptive unscented H infinite filtering algorithm to obtain a SOC estimated value being displayed on the battery management system of the electric vehicle, that reflects a state information of the battery to accurately respond to a status information of the battery and accurately estimate the SOC value of the battery of the electric vehicle so as to manage and control the battery within a safe and reliable working range to improve the vehicle performance and prolong a life span of the battery;
- wherein the step (e) includes updating the one or more noise coefficients by obtaining a covariance of the terminal voltage difference;
- before the step (c), further including determining a relationship between the parameters to be identified and an output quantity according to the second-order RC equivalent circuit model being established, which includes steps of:
- (c1) in view of the second-order RC equivalent circuit model, obtaining a system transfer function by a Laplace transformation; and
- (c2) discretizing the system transfer function by utilizing a bilinear transformation method, and constructing a relationship between a parameter vector to be identified and a system output by taking an open-circuit voltage and a terminal voltage as an output of the system and taking a current value as an input value of the system;
- wherein the parameters to be identified are identified as observed data obtained by the variable forgetting factor recursive least squares algorithm incorporating finite memory under a Hybrid pulse power characterization (HPPC) test, including steps of:
- step (1): setting initial conditions, setting an identification parameter as a real column vector, setting a memory length of a storage queue for storing the observed data, acquiring the observed data, and storing the observed data in the storage queue according to an observation time sequence;
- step (2): selecting an earliest group of data in the storage queue, solving the output equation by utilizing the recursive least squares algorithm to obtain a primary identification parameter as an initial parameter of the variable forgetting factor recursive least squares algorithm incorporating finite memory;
- step (3): according to the output equation and the initial parameter, obtaining a calculation result by utilizing the variable forgetting factor recursive least squares algorithm according to residual observed data in the storage queue;
- step (4): according to a current identification result, obtaining the parameters of the second-order equivalent circuit model;
- step (5): receiving new observed data and removing old observed data of the observed data based on one or more set equation, and updating the observed data in the storage queue; and
- repeating the step (2) to step (5) until all the observed data are processed to obtain a final identification result;
- a relationship between an output terminal voltage and the parameters to be identified in the second-order RC equivalent circuit model being constructed, which is introduced into the incorporated variable forgetting factor recursive least square algorithm incorporating finite memory, and is continuously iterated, so that parameter values being identified are obtained for eliminating an influence of old data on the final identification result;

through incorporating the finite memory window in the variable forgetting factor recursive least squares algorithm, that is during each the parameter identification, setting a memory length for storing the observed data, latest N groups of the observed data are used in the parameter identification, when a group of new data appears, an earliest group of observed time data is discarded correspondingly, wherein N is an integer greater than zero;

an equation derivation of the variable forgetting factor recursive least squares algorithm incorporating finite memory being:

introducing new data into the variable forgetting factor recursive least squares algorithm through the following equation:

$$\begin{cases} e_{k-1+S} = y_{k-1+S} - h_{k-1+S}^T \hat{\theta}_{k-1,k-2+S} \\ \lambda_{k-1+S} = 1 - \dfrac{e_{k-1+S}^2}{1 + h_{k-2+S}^T P_{k,k-2+S} h_{k-2+S}} \\ K_{k-1,k+S} = \dfrac{P_{k,k-2+S} h_{k-1+S}}{\lambda_{k-1+S} + h_{k-1+S}^T P_{k,k-2+S} h_{k-1+S}} \\ \hat{\theta}_{k-1,k+S} = \hat{\theta}_{k,k-2+S} + K_{k-1,k+S} e_{k-1+S} \\ P_{k-1,k+S} = \dfrac{I + K_{k-1,k+S} h_{k-1+S}^T}{\lambda_{k-1+S}} P_{k,k-2+S} \end{cases}$$

in which, e is a vector equation error, representing a difference between an actual observation value and a current prediction value, that is, a prediction error at a current time; λ is a forgetting factor of the forgetting factor recursive least squares algorithm; K is a correction weight value; $\hat{\theta}$ is an optimal estimate of the parameters to be identified before decoding; P is a covariance matrix; k in a subscript represents a k time; j is the memory length; $h_k$ represents an observation vector of kth input and output;

since a set data storage capacity being limited, an addition of new data results in a removal of some old data, and the equation being derived as follows:

$$\begin{cases} e_{k-1+j} = y_{k-1+j} - h_{k-1+j}^T \hat{\theta}_{k-1,k-2+j} \\ \lambda_{k-1+j} = 1 - \dfrac{e_{k-1+j}^2}{1 + h_{k-2+j}^T P_{k,k-2+j} h_{k-2+j}} \\ K_{k-1,k+j} = \dfrac{P_{k,k-2+j} h_{k-1+j}}{\lambda_{k-1+j} + h_{k-1+j}^T P_{k,k-2+j} h_{k-1+j}} \\ \hat{\theta}_{k-1,k+j} = \hat{\theta}_{k,k-2+j} + K_{k-1,k+j} e_{k-1+j} \\ P_{k-1,k+j} = \dfrac{I + K_{k-1,k+j} h_{k-1+j}^T}{\lambda_{k-1+j}} P_{k,k-2+j} \end{cases}$$

in which, $\lambda_{k+L}$ is a variable forgetting factor update equation and j is the memory length;

the one or more noise coefficients $Q_k$ and $R_k$ being updated by calculating a covariance of a terminal voltage difference as follows:

$$\Delta U_k = U_k - \left[ m_0 + R_0 i_k + \frac{m_1}{z_k} - m_2 z_k - m_3 \ln(z_k) - m_4 \ln(1 - z_k) \right]$$

$$F_k \approx \frac{\sum_{n=k-L+1}^{k} \Delta U_n \Delta U_n^T}{L}$$

$$Q_k = K_k F_k K_k^T$$

$$R_k = F_k + \sum_{i=0}^{2n_x} w_i^c (\hat{y}_k^i - U_k + \Delta U)(\hat{y}_k^i - U_k + \Delta U)^T$$

wherein ΔU is an output terminal voltage error value of model k, $\Delta U_n$ is a cumulative sum of n terms; $z_k$ is a SOC of the battery, $F_k$ is an approximation of a covariance of a terminal voltage error of the equivalent model k, wherein noise coefficients $Q_k$ and $R_k$ are updated by obtaining the covariance of the terminal voltage difference, and the one or more noise coefficients $Q_k$ and $R_k$ are adjusted through continuous iteration to get an accurate SOC estimation value; $m_0$, $m_1$, $m_2$, $m_3$, $m_4$ are coefficients of an expression for an error value of a voltage at the system output, respectively.

5. The battery management system according to claim 4, wherein a main framework of the adaptive unscented H infinite filtering algorithm is an unscented Kalman filtering algorithm incorporating H infinite filtering algorithm by minimizing a cost function to filter non-Gaussian noise.

6. The battery management system according to claim 4, wherein the step (d) of combining the adaptive unscented H infinite filtering algorithm with the second-order equivalent circuit model to establish the SOC estimation model further includes steps of:

(d1) initializing a SOC estimation, and assigning a default initial value to a state variable;

(d2) performing state estimation at a time k−1, generating a set of sigma points of the state variable, and calculating corresponding weight values of sampling points;

(d3) performing a time updating, wherein an expected value of a prior state estimation variable and a corresponding error covariance matrix is calculated based on the state variable;

(d4) updating a measurement to calculate an output prediction value and a corresponding covariance matrix; and (d5) modifying a posterior state estimation value based on the covariance matrix of the output prediction value to obtain a modified SOC prediction estimation value.

* * * * *